United States Patent
Miyabe et al.

(10) Patent No.: US 7,749,682 B2
(45) Date of Patent: Jul. 6, 2010

(54) ALKALI-DEVELOPABLE BLACK PHOTOSENSITIVE RESIN COMPOSITION FOR FORMING LIGHT-SHIELDING BARRIER WALL

(75) Inventors: Hidekazu Miyabe, Hiki-gun (JP); Gen Itokawa, Hiki-gun (JP); Atsushi Mashiko, Tokyo (JP); Hiroyuki Nemoto, Tokyo (JP)

(73) Assignees: Nippon Sheet Glass Co., Ltd., Tokyo (JP); Taiyo Ink Mfg. Co., Ltd., Tokyo (JP)

( * ) Notice: Subject to any disclaimer, the term of this patent is extended or adjusted under 35 U.S.C. 154(b) by 0 days.

(21) Appl. No.: 12/325,065

(22) Filed: Nov. 28, 2008

(65) Prior Publication Data

US 2009/0111048 A1 Apr. 30, 2009

Related U.S. Application Data

(63) Continuation of application No. PCT/JP2007/060898, filed on May 29, 2007.

(30) Foreign Application Priority Data

May 30, 2006 (JP) .............................. 2006-149626

(51) Int. Cl.
  *G03F 7/00* (2006.01)
  *G03F 7/004* (2006.01)
  *G03F 7/029* (2006.01)

(52) U.S. Cl. .............. 430/270.1; 430/281.1; 430/286.1; 430/290; 430/905; 430/913; 430/950

(58) Field of Classification Search .............. 430/270.1, 430/7, 286.1, 281.1, 290, 905, 913
See application file for complete search history.

(56) References Cited

U.S. PATENT DOCUMENTS

| | | | | |
|---|---|---|---|---|
| 5,643,471 A | * | 7/1997 | Onishi et al. | 216/23 |
| 5,714,286 A | * | 2/1998 | Uchikawa et al. | 430/6 |
| 5,880,799 A | * | 3/1999 | Inoue et al. | 349/110 |
| 6,137,459 A | * | 10/2000 | Eida et al. | 345/76 |
| 6,396,559 B1 | * | 5/2002 | Kishimoto et al. | 349/156 |
| 6,790,568 B2 | * | 9/2004 | Goto | 430/7 |
| 7,094,814 B2 | * | 8/2006 | Morii et al. | 523/200 |

(Continued)

FOREIGN PATENT DOCUMENTS

JP  9-310030 A  12/1997

(Continued)

OTHER PUBLICATIONS

Machine translation of JP 2006-235153 A (2006).*

*Primary Examiner*—Amanda C. Walke
(74) *Attorney, Agent, or Firm*—Oblon, Spivak, McClelland, Maier & Neustadt, L.L.P.

(57) ABSTRACT

An alkali-developable black photosensitive resin composition for forming a light-shielding barrier wall which comprises, as indispensable components, (A) a carboxyl group-containing photosensitive prepolymer, (B) a photopolymerization initiator, (C) a black pigment, and (D) light-transmitting fine particles. By the use of this composition, light-shielding barrier walls (11) having sufficient light-shielding properties and a height of not less than 20 μm can be formed by photolithography, without causing undercutting during development. In a preferred embodiment, the black pigment (C) is a metal oxide, preferably iron oxide, and the fine particles (D) are inorganic fine particles having a refractive index of 1.40-1.90, preferably silica.

12 Claims, 1 Drawing Sheet

U.S. PATENT DOCUMENTS

2006/0279679 A1* 12/2006 Fujisawa et al. ............. 349/116
2008/0001124 A1* 1/2008 Hachiya et al. ........ 252/301.36

FOREIGN PATENT DOCUMENTS

| | | | |
|---|---|---|---|
| JP | 10-72240 A | 3/1998 | |
| JP | 10-133365 A | 5/1998 | |
| JP | 10-186126 A | 7/1998 | |
| JP | 2002-285007 A | 10/2002 | |
| JP | 2003-202411 A | 7/2003 | |
| JP | 2004-70268 A | 3/2004 | |
| JP | 2006235153 A | * | 9/2006 |
| JP | 2006-276211 A | 10/2006 | |

* cited by examiner

US 7,749,682 B2

ALKALI-DEVELOPABLE BLACK PHOTOSENSITIVE RESIN COMPOSITION FOR FORMING LIGHT-SHIELDING BARRIER WALL

CROSS-REFERENCE TO RELATED APPLICATIONS

This is a continuation of Application PCT/JP2007/060898, filed May 29, 2007, which was published under PCT Article 21(2).

BACKGROUND OF THE INVENTION

1. Field of the Invention

This invention relates to an alkali-developable black photosensitive resin composition for forming a light-shielding barrier wall having a height of not less than 20 µm by photolithography, its cured product, and a light-shielding barrier wall formed from the cured product mentioned above. More particularly, the present invention relates to a black photosensitive resin composition for forming black matrices of a liquid crystal display device, an electronic display device, etc. and light-shielding barrier walls etc. of optics which are used for image transmission devices for writing optical systems of an optical printer etc. or reading optical systems of a scanner, a copying machine, etc.

2. Description of the Prior Art

In recent years, in view of the demand for miniaturizing the electronic equipment, the miniaturization of parts used for them is indispensable. In addition thereto, high resolution is required for the image transmission devices for writing optical systems, such as an optical printer, and for reading optical systems, such as a scanner. Heretofore, a gradient index rod lens array has been used for imaging optical systems used in these image transmission devices. According to this gradient index rod lens array, a very compact erect equal-magnification imaging optical system can be realized. However, since this lens array is produced by arranging many rod lens elements and fixing them with a resin, it tends to generate unevenness of the arrangement of rod-lens elements. Such uneven arrangement had affected the resolution of the lens array and became the cause of generating unevenness of picture in the high-resolution equipment.

As a lens array which can suppress occurrence of such uneven arrangement, a resin erect lens array has been developed recently. A resin erect lens array realizes an erect equal-magnification imaging optical system by laminating two or more flat lens array plates having many lenses formed in the surface of a transparent substrate. Although such a resin erect lens array has been heretofore used in combination with a liquid crystal display element to create a liquid crystal image in a space or on an object. In order to apply a resin erect lens array to an optical printer or a scanner, however, it is necessary to improve resolution and an amount of transmitting light and to reduce the stray light.

In order to reduce the unevenness of arrangement or the stray light in these erect equal-magnification imaging optical systems, it is desirable to form light-shielding portions in the recesses between lenses so that the light collected with the lenses is efficiently transmitted. As a method for forming light-shielding portions to be used in an erect equal-magnification imaging optical system, a method of interposing a sheet of light-shielding film between lens plates (see JP 2004-070268, A) and a method of pouring black ink into the recess between lenses (see JP 2003-202411, A), for example, have so far been devised. However, both methods have the problems in workability and the reproducibility of openings.

On the other hand, in a color filter to be used for a display material in a liquid crystal display, an electronic display, or the like, a thin film of black matrix of several µm thickness is formed between fine pixels colored at least two or more of hues for the purpose of intercepting light and raising contrast and in order to prevent a decrease in the intensity of color. This black matrix is generally formed by photolithography which comprises the steps of applying a composition containing a photosensitive prepolymer and a pigment, such as carbon black, directly added thereto, onto a glass substrate, exposing the resultant coating film to light according to a prescribed pattern, and then performing development. Since the photolithography is suitable for mass production owing to the good workability, it is widely used in the printing industry or the electronics industry still now.

However, such a composition aiming at the light-shielding requires a light-shielding black pigment, such as carbon black, to be contained in the composition in a large amount to make the composition black. Therefore, in photolithography it sustains remarkable underexposure and tends to attain insufficient curing depth. As a result, there are such problems that the undercutting will be easily produced in a developing process and that the adhesiveness to a substrate will be inferior. That is, it will be hardly possible to perform the patterning of a film having the thickness of not less than 20 µm, particularly the thickness in the range of 50 µm to 100 µm, by the photolithography with sufficient degree of blackness because of insufficient curing property in a deep portion of a coating film. Further, If an exposure dose is increased in the step of exposure to light for the purpose of improving the curing property in a deep portion, there is such a problem that halation will become large and the resolution will decrease in proportion to the increase of the exposure dose. Therefore, at present there is no black photosensitive resin composition which is capable of coping with the thick film and forming a film of sufficient degree of blackness having the thickness of not less than 20 µm without causing the undercutting during development.

SUMMARY OF THE INVENTION

The present invention has been made in view of the conventional technology mentioned above. An object of the present invention is to solve the above-mentioned problems involved in a photosensitive resin composition for forming a light-shielding barrier wall and to provide an alkali-developable black photosensitive resin composition which excels in the curing property in a deep portion of a coating film and resolution in the process of exposure to light and is capable of forming a cured product exhibiting sufficient light-shielding effect without causing undercutting during development even if the light-shielding barrier wall has a height of not less than 20 µm, its cured product, and a light-shielding barrier wall formed from this cured product.

To accomplish the object mentioned above, the present invention provides an alkali-developable black photosensitive resin composition for forming a light-shielding barrier wall having a height of not less than 20 µm by photolithography, characterized in that the composition comprises, as indispensable components, (A) a carboxyl group-containing photosensitive prepolymer, (B) a photopolymerization initiator, (C) a black pigment, and (D) light-transmitting fine particles.

In a preferred embodiment, as the black pigment (C) mentioned above, a metal oxide, preferably iron oxide is used, and as the fine particles (D) mentioned above, fine particles having a refractive index falling in the range of 1.40-1.90, preferably silica is used.

According to the present invention, there are further provided a cured product obtained by curing the alkali-developable black photosensitive resin composition mentioned above by irradiation of actinic energy rays and/or by heating and a light-shielding barrier wall formed from the cured product mentioned above.

Further, the present invention provides an optic having such a light-shielding barrier wall. A light-shielding barrier wall of the present invention is suitable for optics, such as a lens, a prism, a color filter, and CCD. Although the light-shielding barrier wall is applicable to any lenses, such as a single lens and a lens array, it is particularly suitable for a plate-like microlens array.

Since the alkali-developable black photosensitive resin composition of the present invention contains (D) light-transmitting fine particles as an indispensable component besides (A) a carboxyl group-containing photosensitive prepolymer, (B) a photopolymerization initiator, and (C) a black pigment, even if a light-shielding barrier wall having a height of not less than 20 μm is formed by photolithography, it excels in the curing property in a deep portion of a coating film and resolution in the process of exposure to light, and thus it is possible to form a thick patterned film which exhibits sufficient light-shielding effect without causing undercutting during development.

BRIEF DESCRIPTION OF THE DRAWINGS

Other objects, features, and advantages of the invention will become apparent from the following description taken together with the drawings, in which.

DETAILED DESCRIPTION OF THE PREFERRED EMBODIMENTS

The present inventors, after pursuing a diligent study in search of a method for solving the problems mentioned above, have found that when (D) light-transmitting fine particles are incorporated into a composition containing as indispensable components (A) a carboxyl group-containing photosensitive prepolymer, (B) a photopolymerization initiator which generates radical species by irradiation of light, and (C) a black pigment, though the degree of blackness becomes low accordingly, it is possible to secure sufficient light-shielding effect by forming a thick light-shielding barrier wall having a height of not less than 20 μm and to attain sufficient curing-property in a deep portion of a coating film in the process of exposure to light because the actinic energy rays reach even the depths owing to the light transmittance of the fine particles (D), and that the above-mentioned purpose can be thus accomplished. The present invention has been perfected based on these findings.

Now, the functions of the alkali developable black photosensitive resin composition of the present invention will be described below with reference to the accompanying drawings.

Figure 1:
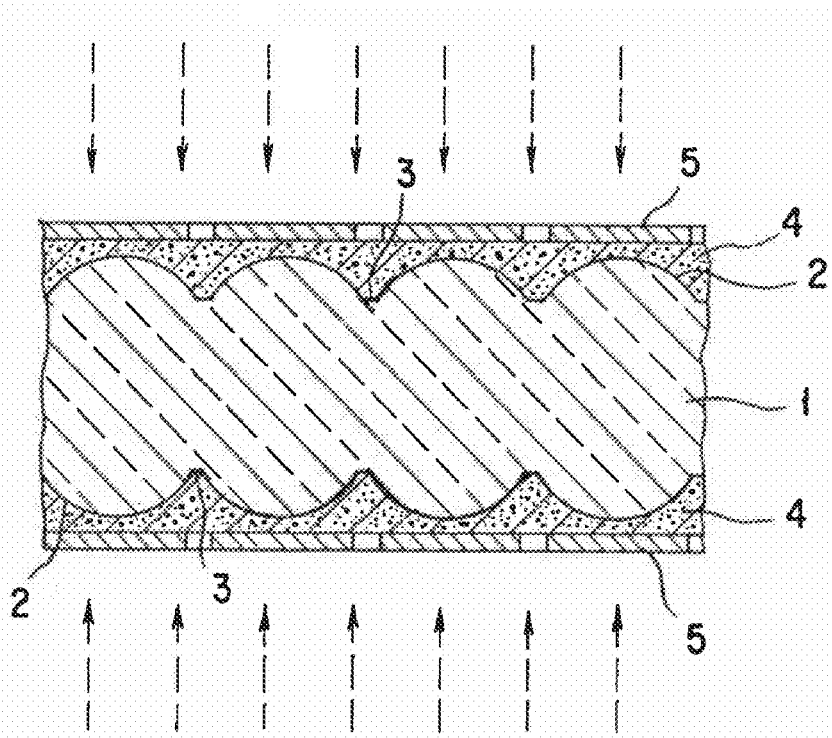
FIG. 1 is a schematic fragmentary sectional view for explaining the process of forming light-shielding barrier walls in a resin erect lens array by photolithography using the black photosensitive resin composition of the present invention.
Figure 2:
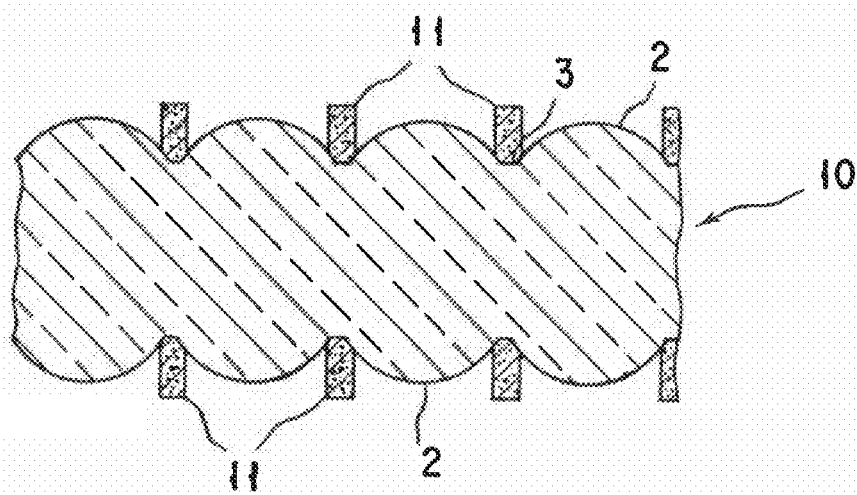
FIG. 2 is a fragmentary sectional view schematically illustrating the resin erect lens array having the light-shielding barrier walls produced by the method shown in FIG. 1.

When a light-shielding barrier wall is formed in a resin erect lens array by photolithography using the alkali-developable black photosensitive resin composition of the present invention, first, a coating film 4 of the black photosensitive resin composition is formed in a flat lens array plate 1 having a plurality of lenses 2 formed on the surface of a transparent substrate, as shown in FIG. 1. Subsequently, a photomask 5 having a predetermined exposure pattern corresponding to a barrier wall pattern is superposed on this coating film 4, and the coating film is selectively irradiated with actinic energy rays for exposure. Alternatively, laser beams etc. are scanned along the recesses 3 between the lenses 2 for direct imaging exposure. Then, after separating the photomask 5 from the plate, unexposed areas are developed with an aqueous alkaline solution to obtain a resin erect lens array 10 having the light-shielding barrier walls 11 formed along the recesses 3 between the lenses 2, as shown in FIG. 2. The light-shielding barrier walls of a high aspect ratio having a desired height can be formed by repeating each step of application, exposure, and development. Incidentally, in this specification the "height" of the light-shielding barrier wall refers to the height from the deepest position contacting the substrate to the uppermost surface of the light-shielding barrier wall. For example, in the case of the resin erect lens array 10 having the light-shielding barrier walls 11 formed as shown in FIG. 2, it refers to the height from the basal bottom of the recess 3 to the uppermost surface of the light-shielding barrier wall 11.

According to the present inventors' researches, if the height of the light-shielding barrier wall formed in this way is not less than 20 μm, it is possible to secure such sufficient light-shielding effect that the transmittance of light is 5% or less, preferably 2% or less, even if the degree of blackness is relatively low. Further, since the aspect ratio can be enlarged, the light diffusion in a transparent part can be effectively prevented by the three-dimensional control of light. According to the light-shielding barrier wall of the present invention, the aspect ratio of 5 or more can also be achieved. If the aspect ratio of 5-10 is achieved, the light diffusion in a transparent part can be effectively prevented by the three-dimensional control of light. Moreover, since the black photosensitive resin composition of the present invention contains the light-transmitting fine particles (D) and light is transmitted via the light-transmitting fine particles during exposure to light, the actinic energy rays reach even the depths and sufficient curing property in a deep portion of a coating film is acquired. Therefore, a coating film obtained excels in resolution and does not cause the undercutting during development, and thus the barrier wall which exhibits sufficient light-shielding effect can be formed. Since the particles (D), particularly inorganic particles are added to the black photosensitive resin composition of the present invention, the thermal expansion coefficient of the resultant light-shielding barrier wall becomes low and the hardness thereof becomes high. As a result, the light-shielding barrier wall excels in thermal stability and does not cause cracks etc., and the stability of the light-shielding barrier wall against stress is also improved. Incidentally, the reflection of light at a film surface can also be suppressed by making the surface of a light-shielding barrier wall into the satin-like state.

In this specification, the "transmittance of light" refers to that measured by the use of an ultraviolet-visible spectrophotometer while irradiating a 20-μm thick dry film with light having a wavelength of 400-800 nm in the thickness direction. The transmittance of light should be measured with a fixed thickness for comparison, because the more the thickness becomes large, the more the transmittance of light becomes low, even with the same degree of blackness.

Now, the black photosensitive resin composition of the present invention will be described in detail below.

First, as the carboxyl group-containing photosensitive prepolymers (A) to be used in the present invention, the following unsaturated group-containing polycarboxylic resins may be cited:

(1) products obtained by the reaction of (a) a polyfunctional epoxy compound having at least two epoxy groups in its molecule with (b) an unsaturated monocarboxylic acid and the subsequent reaction of (c) a saturated or unsaturated polybasic acid anhydride with the resultant hydroxyl group, (2) products obtained by causing (a) a polyfunctional epoxy compound having at least two epoxy groups in its molecule to react with (b) an unsaturated monocarboxylic acid and (d-1) a compound having one reactive group other than an alcoholic hydroxyl group capable of reacting with an epoxy group in its molecule, preferably (d-2) a compound having at least one alcoholic hydroxyl group and one reactive group other than the alcoholic hydroxyl group capable of reacting with an epoxy group in its molecule, and subsequently causing the resultant product with (c) a saturated or unsaturated polybasic acid anhydride, (3) products obtained by causing (g) a compound having one epoxy group and an ethylenically unsaturated double bond in its molecule to react with part of carboxyl groups of a copolymer of (e) an unsaturated carboxylic acid and (f) a compound having an ethylenically unsaturated double bond, (4) products obtained by causing (g) a compound having one epoxy group and an ethylenically unsaturated double bond in its molecule to react with a copolymer of (e) an unsaturated carboxylic acid and (f) a compound having an ethylenically unsaturated double bond and subsequently causing (c) a saturated or unsaturated polybasic acid anhydride to react with the resultant hydroxyl group, (5) products obtained by causing (i) a hydroxyalkyl (meth)acrylate to react with a copolymer of (h) an unsaturated dibasic acid anhydride, such as maleic anhydride, and (f) a compound having an ethylenically unsaturated double bond.

Incidentally, the term "(meth)acrylate" as used in the present specification refers collectively to acrylate and methacrylate, and this holds good for other similar expressions.

The acid value of such a photosensitive prepolymer (A), though having an appropriate range thereof varied with the kind of prepolymer, should generally fall in the range of 50 to 150 mg KOH/g, preferably in the range of 60 to 120 mg KOH/g. Any deviation of the acid value from the aforementioned range is undesirable because the resin will manifest insufficient solubility in an aqueous alkaline solution if the acid value is less than 50 mg KOH/g. Conversely, the acid value exceeding 150 mg KOH/g will give cause to deteriorate the various properties of the cured film such as resistance to alkalis, resistance to water, and resistance to moisture.

The photosensitive prepolymer (A) of above-mentioned (1) is a carboxyl group-containing photosensitive resin obtained by the reaction of (a) a polyfunctional epoxy compound having at least two epoxy groups in its molecule, preferably a solid polyfunctional epoxy compound, with (b) a photosensitive unsaturated monocarboxylic acid and the subsequent reaction of (c) a saturated or unsaturated polybasic acid anhydride with the resultant hydroxyl group.

As the polyfunctional epoxy compound (a) mentioned above, various well-known and popularly adopted epoxy resins such as, for example, glycidyl ether compounds such as bisphenol A type epoxy resins, bisphenol F type epoxy resins, bisphenol S type epoxy resins, brominated bisphenol A type epoxy resins, hydrogenated bisphenol A type epoxy resins, biphenol type epoxy resins, bixylenol type epoxy resins, phenol novolak type epoxy resins, cresol novolak type epoxy resins, brominated phenol novolak type epoxy resins, bisphenol A novolak type epoxy resins, trihydroxyphenyl methane type epoxy resins, tetraphenylol ethane type epoxy resins, naphthalene skeleton-containing phenol novolak type epoxy resins, and dicyclopentadiene skeleton-containing phenol novolak type epoxy resins; glycidyl ester compounds such as diglycidyl terephthalate; alicyclic epoxy resins represented by EHPE-3150 (trade name) produced by Daicel Chemical Industries, Ltd.; heterocyclic epoxy resins such as triglycidyl isocyanurate; glycidylamines such as N,N,N',N'-tetraglycidyl methaxylene diamine; and any well known and widely used epoxy compounds such as copolymers of glycidyl (meth)acrylate and a compound containing an ethylenically unsaturated double bond may be used. Among other epoxy compounds cited above, phenol novolak type epoxy resins, cresol novolak type epoxy resins, and copolymers of glycidyl (meth)acrylate and a compound containing an ethylenically unsaturated double bond which are solid and polyfunctional prove to be particularly desirable. These epoxy resins may be used either singly or in the form of a combination of two or more members.

In the case of the above-mentioned copolymer of glycidyl (meth)acrylate and a compound containing an ethylenically unsaturated double bond, the molar fraction of glycidyl (meth)acrylate is desired to be in the range of 20-60 mol %. If the molar fraction of glycidyl (meth)acrylate to the copolymer is less than 20 mol %, the copolymer will be at a disadvantage in acquiring an unduly low photocuring property due to the reduction in the amount of addition of the unsaturated monocarboxylic acid. Conversely, if the molar fraction of glycidyl (meth)acrylate exceeds 60 mol %, the copolymer will be at a disadvantage in failing to allow the synthesis to proceed smoothly. Further, in the case of such a copolymer of glycidyl (meth)acrylate and a compound containing an ethylenically unsaturated double bond, the weight-average molecular weight thereof is desired to be in the range of 10,000 to 70,000, preferably in the range of 15,000 to 60,000. If the weight-average molecular weight is less than 10,000, the resultant coating film will be at a disadvantage in acquiring unduly low dryness to the touch of finger. Conversely, if it exceeds 70,000, the composition will be at a disadvantage in acquiring an unduly low developing property.

As concrete examples of the unsaturated monocarboxylic acid (b) mentioned above, acrylic acid, methacrylic acid, itaconic acid, β-carboxylethyl acrylate, β-carboxylethyl methacrylate, and the compounds obtained by the addition of a polybasic acid anhydride to a hydroxyl group-containing (meth)acrylate may be cited. Among other unsaturated monocarboxylic acids cited above, acrylic acid and methacrylic acid prove to be particularly desirable from the viewpoint of the photosensitivity of the photosensitive prepolymer obtained and the storage stability of the composition. These unsaturated monocarboxylic acids (b) may be used either singly or in the form of a mixture of two or more members.

The ratio of addition of the unsaturated monocarboxylic acid to the polyfunctional epoxy compound (a) mentioned above is preferred to be 0.95 to 1.10 equivalent weights per one equivalent weight of an epoxy group of the polyfunctional epoxy compound. If the amount of addition of the unsaturated monocarboxylic acid is less than 0.95 equivalent weight, it is at a disadvantage that unreacted epoxy groups remain and the storage stability of the resultant prepolymer after addition of the saturated or unsaturated polybasic acid anhydride will be deteriorated. Conversely, if the amount exceeds 1.10 equivalent weights, it is at a disadvantage that the unreacted unsaturated monocarboxylic acid remains and an offensive smell will be increased.

As concrete examples of the saturated or unsaturated polybasic acid anhydride (c) mentioned above, alicyclic dibasic acid anhydrides such as methyltetrahydrophthalic anhydride, tetrahydrophthalic anhydride, hexahydrophthalic anhydride, methylhexahydrophthalic anhydride, nadic anhydride, 3,6-endomethylenetetrahydrophthalic anhydride, methylendomethylenetetrahydrophthalic anhydride, and tetrabromophthalic anhydride; aliphatic or aromatic polybasic acid anhydrides such as succinic anhydride, maleic anhydride, itaconic anhydride, octenylsuccinic anhydride, pentadodecenylsuccinic anhydride, phthalic anhydride, and trimellitic anhydride may be cited. These saturated or unsaturated polybasic acid anhydrides may be used either singly or in the form of a combination of two or more members. Among other polybasic acid anhydrides cited above, alicyclic dibasic acid anhydrides prove to be particularly desirable from the viewpoint of developability.

The amount of addition of the saturated or unsaturated polybasic acid anhydride (c) is desired to be in such a proportion that the anhydride group is in the range of 0.3 to 0.8 equivalent weight per one equivalent weight of an alcoholic hydroxyl group caused by the reaction of the polyfunctional epoxy compound (a) with the unsaturated monocarboxylic acid (b) mentioned above, preferably such that the acid value of the produced photosensitive prepolymer (A) falls in the range of 50 to 150 mg KOH/g.

The photosensitive prepolymer (A) of above-mentioned (2) is a carboxyl group-containing photosensitive resin obtained by the reaction of (a) a polyfunctional epoxy compound having at least two epoxy groups in its molecule, preferably a solid polyfunctional epoxy compound, with (b) an unsaturated monocarboxylic acid which is photosensitive and (d-1) a compound having one reactive group (for example, carboxyl group, phenolic hydroxyl group, secondary amino group, etc.) other than an alcoholic hydroxyl group capable of reacting with an epoxy group in its molecule, preferably (d-2) a compound having at least one alcoholic hydroxyl group and one reactive group other than an alcoholic hydroxyl group capable of reacting with an epoxy group in its molecule, and the subsequent reaction of (c) a saturated or unsaturated polybasic acid anhydride with the resultant product.

By the reaction of the aforementioned compound (d-1) having one reactive group other than an alcoholic hydroxyl group capable of reacting with an epoxy group in its molecule to the polyfunctional epoxy compound, though the density of photosensitive groups decreases in comparison with the carboxyl group-containing photosensitive resin (1) mentioned above, the hydrophobic nature of the resultant resin may be increased depending on the selection of the compound and thus the resistance to gold plating and PCT resistance may be improved. As the compound (d-1) having the hydrophobic nature and having one reactive group other than an alcoholic hydroxyl group capable of reacting with an epoxy group in its molecule, alkyl phenols such as pentyl phenol, dipentyl phenol, octyl phenol, nonyl phenol, and dodecyl phenol; and monocarboxylic acids such as n-hexanoic acid, dimethyl butyrate, ethyl butyrate, benzoic acid, toluic acid, and ethyl benzoate may be cited.

Furthermore, by the reaction of the compound (d-2) having at least one, alcoholic hydroxyl group, preferably primary alcoholic hydroxyl group, and one reactive group other than an alcoholic hydroxyl group capable of reacting with an epoxy group in its molecule to the polyfunctional epoxy compound, though the density of photosensitive groups decreases in comparison with the carboxyl group-containing photosensitive resin (1) mentioned above, the carboxyl group is introduced into the site apart from the main skeleton when the saturated or unsaturated polybasic acid anhydride (c) is caused to react with the resultant product. As a result, the resultant photosensitive prepolymer has the flexibility and can be developed even if it has a low acid value.

As the compound (d-2) having at least one alcoholic hydroxyl group, preferably primary alcoholic hydroxyl group, and one reactive group other than an alcoholic hydroxyl group capable of reacting with an epoxy group in its molecule, for example, polyhydroxy monocarboxylic acids such as dimethylol propionic acid, dimethylol acetic acid, dimethylol butyric acid, dimethylol valeric acid, and dimethylol caproic acid; hydroxyalkyl phenols or hydroxyalkyl cresols such as bis(hydroxymethyl)phenol, hydroxymethyl-di-t-buthyl phenol, p-hydroxyphenyl-2-methanol, p-hydroxyphenyl-3-propanol, p-hydroxyphenyl-4-butanol, hydroxyethyl cresol, 2,6-dimethyl-4-hydroxymethyl phenol, 2,4-dihydroxymethyl-2-cyclohexyl phenol, trimethylol phenol, and 3,5-dimethyl-2,4,6-trihydroxymethyl phenol; esterification products of a phenol having a carboxyl group-containing substituent such as hydroxybenzoic acid, hydroxyphenylbenzoic acid and hydroxyphenoxybenzoic acid with ethylene glycol, propylene glycol, glycerol, diethylene glycol, etc.; monoethylene oxide adduct of bisphenol, monopropylene oxide adduct of bisphenol; p-hydroxyphenetyl alcohol; and dialkanol amines such as diethanol amine and diisopropanol amine may be cited. As the particularly preferred compounds, dimethylol propionic acid and p-hydroxyphenetyl alcohol, for example, may be cited.

The synthesis of the carboxyl group-containing photosensitive resin (2) mentioned above is attained by the first method which comprises causing an unsaturated monocarboxylic acid (b) [or a compound (d-1, d-2)] to react with a polyfunctional epoxy compound (a), then causing a compound (d-1, d-2) [or an unsaturated monocarboxylic acid (b)] to react with the resultant reaction product, or by the second method which comprises causing simultaneous reaction of the polyfunctional epoxy compound (a), the unsaturated monocarboxylic acid (b), and the compound (d-1, d-2). Though these two methods are both available, the second method proves more advantageous. Appropriately, the reaction mentioned above is accomplished between one equivalent weight of the epoxy group of the polyfunctional epoxy compound (a) and a total of about 0.8-1.3 mols, particularly preferably about 0.9-1.1 mols, of the unsaturated monocarboxylic acid (b) and the compound (d-1, d-2) mentioned above. Properly, the ratio of the amounts of the unsaturated monocarboxylic acid (b) and the compound (d-1, d-2) to be used is such that the amount of the compound (d-1, d-2) to be used may fall in the range of 0.05 to 0.5 mol, preferably 0.1 to 0.3 mol, based on 1 mol of the total of the amounts of the unsaturated monocarboxylic acid (b) and the compound (d-1, d-2).

The photosensitive prepolymer (A) of above-mentioned (3) is a carboxyl group-containing photosensitive resin obtained by causing (g) a photosensitive compound having one epoxy group and an ethylenically unsaturated double bond in its molecule to react with part of carboxyl groups (the carboxyl group required for the alkali-development should be remained) of a copolymer of (e) an unsaturated carboxylic acid and (f) a compound having an ethylenically unsaturated double bond. The weight-average molecular weight of the copolymer of (e) the unsaturated carboxylic acid and (f) the compound having an ethylenically unsaturated double bond, which is a skeleton of this carboxyl group-containing photosensitive resin (3), is desired to be in the range of 10,000 to 70,000, preferably in the range of 15,000 to 60,000. If the weight-average molecular weight is less than 10,000, the resultant coating film will be at a disadvantage in acquiring unduly low dryness to the touch of finger. Conversely, if it exceeds 70,000, the composition will be at a disadvantage in acquiring an unduly low developing property.

As the unsaturated carboxylic acid (e) mentioned above, unsaturated monocarboxylic acids, such as acrylic acid, methacrylic acid, half esters of a hydroxyl group-containing (meth)acrylate and a saturated dibasic acid anhydride, and half esters of maleic anhydride and alcohols; unsaturated dicarboxylic acids, such as maleic acid, fumaric acid, and itaconic acid, etc. may be cited. These unsaturated carboxylic acids may be used either singly or in the form of a combination of two or more members.

As the compound (f) having an ethylenically unsaturated double bond mentioned above, for example, styrene, chlorostyrene, and α-methylstyrene; acrylates, methacrylates or fumarates possessing substituent(s) such as methyl, ethyl, propyl, isopropyl, n-butyl, isobutyl, t-butyl, amyl, 2-ethylhexyl, octyl, capryl, nonyl, dodecyl, hexadecyl, octadecyl, cyclohexyl, isobornyl, methoxyethyl, butoxyethyl, 2-hydroxyethyl, 2-hydroxypropyl, or 3-chloro-2-hydroxypropyl; monoacrylates or monomethacrylates of polyethylene glycol and monoacrylates or monomethacrylates of polypropylene glycol; vinyl acetate, vinyl butyrate, and vinyl benzoate; maleimides such as cyclohexylmaleimide and phenylmaleimide; olefins such as ethylene and propylene; and acrylonitrile may be cited. These compounds may be used either singly or in the form of a combination of two or more members.

As the compound (g) having one epoxy group and an ethylenically unsaturated double bond in its molecule mentioned above, glycidyl (meth)acrylate, β-methylglycidyl (meth)acrylate, β-ethylglycidyl (meth)acrylate, N-[4-(2,3-epoxypropoxy)-3,5-dimethylbenzyl]acrylamide, N-[4-(2,3-epoxypropoxy)-3,5-dimethylbenzyl]methacrylamide, glycidyl crotonate, 3,4-epoxycyclohexylmethyl (meth)acrylate, etc. may be cited. Among other compounds cited above, glycidyl (meth)acrylate proves to be desirable from the viewpoint of reactivity.

The photosensitive prepolymer (A) of above-mentioned (4) is a carboxyl group-containing photosensitive resin obtained by causing an epoxy group of (g) a compound having one epoxy group and an ethylenically unsaturated double bond in its molecule to react with a carboxylic group of a copolymer of (e) an unsaturated carboxylic acid and (f) a compound having an ethylenically unsaturated double bond and subsequently causing (c) a saturated or unsaturated polybasic acid anhydride to react with the resultant hydroxyl group. Since this carboxyl group-containing photosensitive resin (4) has the carboxyl group separated from the main skeleton as compared with the carboxyl group-containing photosensitive resin (3) mentioned above, it exhibits high reactivity and improved developing property. The weight-average molecular weight of the copolymer of (e) the unsaturated carboxylic acid and (f) the compound having an ethylenically unsaturated double bond, which is a skeleton of this carboxyl group-containing photosensitive resin (4), is desired to be in the range of 10,000 to 70,000, preferably in the range of 15,000 to 60,000, like the carboxyl group-containing photosensitive resin (3) mentioned above. If the weight-average molecular weight is less than 10,000, the resultant coating film will be at a disadvantage in acquiring unduly low dryness to the touch of finger. Conversely, if it exceeds 70,000, the composition will be at a disadvantage in acquiring an unduly low developing property.

The photosensitive prepolymer (A) of above-mentioned (5) is a carboxyl group-containing photosensitive resin obtained by causing (i) a hydroxyalkyl (meth)acrylate to react with a copolymer of (h) an unsaturated dibasic acid anhydride, such as maleic anhydride, and (f) a compound having an ethylenically unsaturated double bond. The weight-average molecular weight of the copolymer of (h) the unsaturated dibasic acid anhydride and (f) the compound having an ethylenically unsaturated double bond, which is a skeleton of this carboxyl group-containing photosensitive resin (5), is desired to be in the range of 1,000 to 20,000, preferably in the range of 2,000 to 10,000. If the weight-average molecular weight is less than 1,000, the resultant coating film will be at a disadvantage in acquiring unduly low dryness to the touch of finger. Conversely, if it exceeds 20,000, the synthesis of the copolymer will be allowed only with difficulty and the composition will be at a disadvantage in acquiring an unduly low developing property.

As the unsaturated dibasic acid anhydride (h) mentioned above, although itaconic acid anhydride, 3,4,5,6-tetrahydrophthalic anhydride, etc. may be cited besides maleic anhydride, maleic anhydride is preferred from the viewpoint of reactivity.

As the hydroxyalkyl (meth)acrylate (i) mentioned above, 2-hydroxyethyl (meth)acrylate, 2-hydroxypropyl (meth)acrylate, 4-hydroxybutyl (meth)acrylate, etc. may be cited. It is preferred that such a compound should be added in a proportion of not less than the number of equivalent of the acid anhydride group of the unsaturated dibasic acid anhydride (h) mentioned above to make it react with the acid anhydride group. The reason is because the storage stability of the composition will become poor if the residual acid anhydride group is present therein.

Among other photosensitive prepolymers (A) mentioned above, in the black photosensitive resin composition of the present invention exhibiting high shielding ability, the photosensitive prepolymers of above-mentioned (3), (4) and (5) containing fewer functional groups which exhibit absorption in the wavelength region sensitive to ultraviolet light, such as an aromatic ring, are preferred, and the photosensitive prepolymer of above-mentioned (4) which excels in the photosensitivity and the developing property is particularly preferred.

The photopolymerization initiator of the component (B) which constitutes the black photosensitive resin composition of the present invention is a radical generator which generates an active radical by irradiation of light. Any known and widely used compounds such as, for example, aminoacetophenones like 2-methylthio-1-[4-(methylthio)phenyl]-2-morpholino-propan-1-one and 2-benzyl-2-dimethylamino-1-(4-morpholinophenyl)-butan-1-one; and thioxanthones like 2,4-dimethylthioxanthone, 2,4-diisopropylthioxanthone, and 2-chlorothioxanthone may be used. These photo-radical polymerization initiators may be used either singly or in the form of a combination of two or more members. The amount of the aforementioned photo-radical polymerization initiator to be incorporated in the composition is desired to be in the range of 0.1 to 30 parts by weight, based on 100 parts by weight of the aforementioned photosensitive prepolymer (A). If the amount of the photo-radical polymerization initiator to be used is less than the lower limit of the range mentioned above, the composition will not be photo-cured by irradiation of actinic energy rays or the irradiation time should be prolonged, and a coating film of satisfactory properties will be obtained only with difficulty. Conversely, even if the photo-radical polymerization initiator is added to the composition in a large amount exceeding the upper limit of the range mentioned above, the composition will not attain the further improvement in the curing property and such a large amount is not desirable from the economical viewpoint.

The black pigment of the component (C) which constitutes the black photosensitive resin composition of the present invention is not limited to a particular one insofar as it has sufficient light-shielding effect. As the examples thereof, a metal oxide, carbon black, lamp black, bone black, graphite, aniline black, cyanine black, titanium black, etc. may be cited. As a metal oxide, those containing one or more oxides of Fe, Cr, Mn, Co, etc. as main components thereof, for example, $CrO_3$, $Cr_2O_3$, MnO, $Mn_3O_4$, $Mn_2O_3$, $MnO_2$, FeO, $Fe_2O_3$, $Fe_3O_4$, CoO, $CO_3O_4$, NiO, $Cu_2O$, $ZrO_2$, $MoO_3$, $TiO_2$, etc. may be cited. Further, composite metal oxides, such as $Mn_2O_3$—CuO—$Fe_2O_3$, CoO—$Cr_2O_3$—$Fe_2O_3$, CuO—$Mn_2O_3$—$Cr_2O_3$, and CuO—$Cr_2O_3$, may also be used. Among other metal oxides cited above, iron oxide is preferred from the viewpoint of printing properties, embedding properties, and defoaming properties. From the viewpoint of the degree of resolution, the black pigment (C) is preferred to have an average particle diameter of not more than 20 μm, preferably not more than 5 μm. The amount of the black pigment (C) to be incorporated in the composition is desired to be in the proportion of 0.1-7 vol. %, preferably 0.3-6 vol. %, of the total volume of the composition. If the amount of the black pigment to be used is less than 0.1 vol. %, the degree of blackness which shows sufficient light-shielding effect will be obtained only with difficulty. Conversely, the amount exceeding 7 vol. % is not preferred because the composition will tend to cause the reduction in the hardness of the resultant coating film.

The light-transmitting fine particles of the component (D) which constitutes the black photosensitive resin composition of the present invention is added for the purpose of improving such characteristics as the curing property in a deep portion of a coating film, the adhesiveness and hardness of a coating film. Both inorganic particles and organic particulates may be used as long as they are light-transmitting fine particles. As concrete examples of the inorganic fine particles, well-known and widely used inorganic fillers such as barium sulfate, talc, and silica may be cited. On the other hand, as the organic fine particulates, for example, powdery cross-linked acrylic polymer (such as, for example, MR-2G and MR-7G manufactured by Soken Chemical & Engineering Co., Ltd., and TECH-POLYMER manufactured by Sekisui Plastics Co., Ltd.) etc. may be cited. It is desirable that these fine particles (D) should exhibit small difference in refractive index between the particle and an organic component, such as the photosensitive prepolymer (A), in the composition so that they can serve as the optical path for curing a coating film to a deep portion thereof while suppressing halation, without hindering advance of the light within a coating film when photo-cured. For example, those having a refractive index in the range of 1.40-1.90, preferably 1.45-1.65 are desirable. Among other particles, silica is more preferred from the viewpoint of a refractive index. The amount of the fine particles (D) to be incorporated in the composition is desired to be not less than 50 parts by weight and not more than 500 parts by weight, preferably not less than 80 parts by weight and not more than 200 parts by weight, based on 100 parts by weight of the photosensitive prepolymer (A) mentioned above. If the amount thereof is less than 50 parts by weight, the curing property in a deep portion of a coating film and the adhesiveness of a coating film will be deteriorated. Conversely, the amount exceeding 500 parts by weight is not preferred because the composition will cause the reduction in the hardness of the coating film. From the viewpoint of the degree of resolution, the fine particles (D) are preferred to have an average particle diameter of not more than 20 μm, preferably not more than 5 μm. Particularly, the use of the fine particles in combination of coarse grain and fine grain is preferred because a cured film will assume the lusterless state which prevents irregular reflection of light, thereby improving the light-shielding effect.

The black photosensitive resin composition of the present invention may incorporate therein, as occasion demands, a photopolymerizable monomer (E) for the purpose of improving photo-curing property or the like. As the photopolymerizable monomer (E), any polyfunctional monomers such as hydroxyethyl (meth)acrylate, hydroxypropyl (meth)acrylate, 2-ethylhexyl (meth)acrylate, benzyl (meth)acrylate, ethylene glycol di(meth)acrylate, 1,6-hexanediol di(meth)acrylate, an adduct of bisphenol A diglycidyl ether with 2 mols of (meth)acrylic acid, trimethylolpropane tri(meth)acrylate, pentaerythritol tri(meth)acrylate, and tetra (meth)acrylates may be suitably used, but the photopolymerizable monomer is not limited to these compounds. The amount of a photopolymerizable monomer (E) is desired to be used in the proportion of not more than 60 parts by weight, based on 100 parts by weight of the photosensitive prepolymer (A). In case the amount exceeds 60 parts by weight, the resultant coating film will be at a disadvantage in acquiring unduly low dryness to the touch of finger.

The black photosensitive resin composition of the present invention may incorporate therein, as occasion demands, an organic solvent (F) for dilution for the purpose of adjusting the viscosity of the composition. As the organic solvents (F), any well-known and widely used organic solvents such as, for example, ketones like methylethyl ketone and cyclohexanone; aromatic hydrocarbons like toluene, xylene, and tetramethyl benzene; glycol ethers like cellosolve, methyl cellosolve, butyl cellosolve, carbitol, methyl carbitol, butyl carbitol, propylene glycol monomethyl ether, dipropylene glycol monomethyl ether, dipropylene glycol diethyl ether, and tripropylene glycol monomethyl ether; esters like ethyl acetate, butyl acetate, butyl lactate, cellosolve acetate, butyl cellosolve acetate, carbitol acetate, butyl carbitol acetate, propylene glycol monomethylether acetate, dipropylene glycol monomethyl ether acetate, and propylene carbonate; aliphatic hydrocarbons like octane and decane; and petroleum solvents like petroleum ether, petroleum naphtha, and solvent naphtha may be used. These organic solvents may be used either singly or in the form of a combination of two or more members.

The black photosensitive resin composition of the present invention may incorporate therein, as desired, a well-known and widely used additive such as a thermopolymerization inhibitor, a thickening agent, an anti-foaming agent, a leveling agent, and a coupling agent.

The black photosensitive resin composition of the present invention obtained as described above is adjusted to a level of viscosity suitable for coating by addition of a diluent (the above-mentioned photopolymerizable monomer as a reactive diluent or the above-mentioned organic solvent), thereafter applied by a suitable coating method, such as a screen printing method, a curtain coating method, a roll coating method, a dip coating method, and a spin coating method, to a desired substrate, and then predried at a temperature in the approximate range of 60 to 120° C., for example, thereby to evaporate the organic solvent from the composition and give rise to a coating film. When the composition is in the state of a dry film, it may be simply laminated on the substrate. Thereafter, when the composition coated on the substrate is irradiated with actinic energy rays or heated, it hardens promptly.

Since in the black photosensitive resin composition of the present invention the photosensitive prepolymer (A) contains the carboxyl group, a patterned film may be formed by selectively exposing the coating film to actinic energy rays through a photomask having a prescribed exposure pattern or by directly projecting a laser beam on the coating film according to a prescribed image pattern and then developing the unexposed area of the coating film with an aqueous alkaline solution. Further, a patterned thick film of desired thickness may be formed by repeating each process of application, exposure to light, and development.

As an aqueous alkaline solution to be used in the process of development mentioned above, aqueous alkaline solutions of sodium hydroxide, potassium hydroxide, sodium carbonate, potassium carbonate, sodium silicate, ammonia, organic amines, tetramethylammonium hydroxide, etc. can be used. The concentration of an alkali in the developing solution may be proper generally in the range of 0.1 to 5.0 wt. %. As the developing method, various known methods such as dipping development, paddling development, and spraying development may be adopted.

As the light sources for emitting the actinic energy rays, a low-pressure mercury lamp, a medium-pressure mercury lamp, a high-pressure mercury lamp, an ultra-high-pressure mercury lamp, a xenon lamp, and a metal halide lamp, etc. are suitable. Besides, laser beams may also be utilized as the actinic energy rays for exposure. Further, electron beams, α-rays, β-rays, γ-rays, X-rays, neutron beams, etc. may be utilized.

EXAMPLES

Now, the present invention will be described more specifically below with reference to working examples and comparative examples. It should be noted, however, that the following Examples are intended to be merely illustrative of and in any sense restrictive of the present invention. Wherever the term "parts" is used hereinbelow, it invariably refers to that based on weight unless otherwise specified.

Examples 1, 2 and Comparative Examples 1-3

The black photosensitive resin compositions containing components accounting for varying ratios of combination shown in Table 1 were prepared, wherein the black strength of each composition was adjusted to such a level that the transmittance of light of a wavelength of 400-800 nm through a dry film of 20 μm thickness measured using an ultraviolet-visible spectrophotometer (manufactured by JASCO Corporation) should be 1%. Each composition was tested and evaluated for the following characteristics.

TABLE 1

| Composition | Example No. | | Comparative Example No. | | |
|---|---|---|---|---|---|
| (parts by weight) | 1 | 2 | 1 | 2 | 3 |
| Unsaturated group-containing alkali-soluble resin *1 | 50 | 50 | 50 | 50 | 50 |
| Copolymer resin *2 | 50 | 50 | 50 | 50 | 50 |
| Polyfunctional acryl monomer *3 | 50 | 50 | 50 | 25 | 25 |
| Polyfunctional acryl monomer *4 | — | — | — | 25 | — |
| Polyfunctional acryl monomer *5 | — | — | — | — | 25 |

TABLE 1-continued

| Composition | Example No. | | Comparative Example No. | | |
|---|---|---|---|---|---|
| (parts by weight) | 1 | 2 | 1 | 2 | 3 |
| Photopolymerization initiator *6 | 15 | 15 | 15 | 15 | 15 |
| Photopolymerization initiator *7 | 5 | 5 | 5 | 5 | 5 |
| Iron Oxide *8 | 45 | 55 | 35.0 | 35.0 | 35.0 |
| Silica *9 | 80 | 150 | — | — | — |

*1 Cyclomer P(ACA)320 (manufactured by Daicel Chemical Industries Ltd.)
*2 DIANAL LR-977 (manufactured by Mitsubishi Rayon Co., Ltd.)
*3 2,2-Bis[4-(methacryloxy-polyethoxy)phenyl] propane
*4 Dipentaerythritol hexaacrylate
*5 Trimethylolpropane triacrylate
*6 2-Methyl-1-[4-(methylthio)phenyl]-2-morpholinopropan-1-one
*7 2,4-Diethylthioxanthone
*8 KN-370 (manufactured by Toda Kogyo Corp., average particle diameter determined by BET method: 0.17 μm)
*9 FS-3DC (manufactured by Denki Kagaku Kogyo K.K., particle size distribution (represented by accumulated % by weight): ≦1 μm: 15.9%, ≦1.5 μm: 26.3%, ≦2 μm: 35.9%, ≦3 μm: 54.1%, ≦4 μm: 70.1%, ≦6 μm: 90.2%, ≦8 μm: 97.7%, ≦12 μm: 100.0%)

<Characteristic Evaluation 1> Curing Property in a Deep Portion of a Coating Film:

Each of the black photosensitive resin compositions of Examples 1, 2 and Comparative Examples 1-3 prepared in varying ratios of combination shown in Table 1 was applied onto a soda lime glass substrate to form a dried coating film of 50 μm thickness. Each substrate was exposed to light from the back side of the glass by the use of an ultra-high-pressure mercury lamp with various exposure doses and then developed with an aqueous 1 wt. % sodium carbonate solution for 120 seconds so as to cause over development. The curing property in a deep portion of a coating film was evaluated by determining the thickness of the remaining coating film. The results are shown in Table 2.

TABLE 2

| | Curing property in deep portion (μm) | | | | |
|---|---|---|---|---|---|
| Exposure Dose | Example No. | | Comparative Example No. | | |
| (mJ/cm$^2$) | 1 | 2 | 1 | 2 | 3 |
| 300 | 14 | 18 | 10 | 12 | 12 |
| 500 | 16 | 20 | 12 | 13 | 14 |
| 700 | 18 | 23 | 13 | 14 | 16 |
| 900 | 21 | 25 | 14 | 16 | 17 |
| 1300 | 23 | 28 | 16 | 17 | 17 |

<Characteristic Evaluation 2> Resolution:

Each of the black photosensitive resin compositions of Examples 1, 2 and Comparative Examples 1-3 prepared in varying ratios of combination shown in Table 1 was applied onto a soda lime glass substrate to form a dried coating film of 20 μm thickness. Each substrate was exposed to light by the use of an ultra-high-pressure mercury lamp through a negative mask of a line/space pattern of L/S=80/400 μm and then developed with an aqueous 1 wt. % sodium carbonate solution for 30 seconds. The line width of the obtained pattern was measured with a light microscope. The results are shown in Table 3. Incidentally, the pattern of which line width is hardly measured was evaluated on the following criterion.

Δ: Breakage of pattern occurred due to undercutting.

X: Pattern was separated by the development and the coating film was not remained.

TABLE 3

| Exposure Dose | L/S (μm) (negative dimension 80/400) | | | | |
|---|---|---|---|---|---|
| | Example No. | | Comparative Example No. | | |
| (mJ/cm²) | 1 | 2 | 1 | 2 | 3 |
| 300 | X | Δ | X | X | X |
| 500 | Δ | 82/398 | X | X | X |
| 700 | Δ | 84/396 | X | X | X |
| 900 | Δ | 85/395 | X | Δ | Δ |
| 1300 | 84/396 | 87/393 | Δ | Δ | Δ |

<Characteristic Evaluation 3> Adhesiveness:

Each of the black photosensitive resin compositions of Examples 1, 2 and Comparative Examples 1-3 prepared in varying ratios of combination shown in Table 1 was applied onto a soda lime glass substrate to form a dried coating film of 20 μm thickness. Each substrate was exposed to light by the use of an ultra-high-pressure mercury lamp through a negative mask of a line/space pattern of L/S=80/400 μm with various exposure doses and then developed with an aqueous 1 wt. % sodium carbonate solution for 30 seconds. Thereafter, the state of the cured film after the tape peeling test was visually examined to evaluate the adhesiveness to the substrate. The results are shown in Table 4. The criterion for evaluation of adhesiveness is as follows. With respect to the substrate in which peeling of a film has been fully confirmed with a prescribed exposure dose, subsequent examination with an exposure dose lower than that exposure dose was not done, which is indicated by "–" in Table 4.

○: Absolutely no peeling of the film from the substrate observed.

X: Peeling of the film from the substrate observed.

TABLE 4

| Exposure Dose | L/S (μm) (negative dimension 80/400) | | | | |
|---|---|---|---|---|---|
| | Example No. | | Comparative Example No. | | |
| (mJ/cm²) | 1 | 2 | 1 | 2 | 3 |
| 300 | — | X | — | — | — |
| 500 | X | ○ | — | — | — |
| 700 | X | ○ | — | — | — |
| 900 | X | ○ | — | X | X |
| 1300 | ○ | ○ | X | X | X |

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

The black photosensitive resin composition of the present invention is advantageously applicable for the formation of a light-shielding barrier wall which is used in various fields, such as a black matrix of a liquid crystal display device, an electronic display device, etc., and image transmission devices for writing optical systems of an optical printer etc. or reading optical systems of a scanner, a copying machine, etc.

The International Application PCT/JP2007/060898, filed May 29, 2007, describes the invention described hereinabove and claimed in the claims appended hereinbelow, the disclosure of which is incorporated here by reference.

What is claimed is:

1. An alkali-developable black photosensitive resin composition for photolithography, comprising:
a carboxyl group-containing photosensitive prepolymer;
a photopolymerization initiator;
a black pigment; and
a plurality of light-transmitting fine particles,
wherein said black pigment has an average particle diameter of not more than 20 μm, said plurality of light-transmitting fine particles has an average particle diameter of not more than 20 μm, and said alkali-developable black photosensitive resin composition is capable of forming a light-shielding barrier wall having a height of not less than 20 μm by photolithography.

2. The composition according to claim 1, wherein said black pigment (C)-is comprises a metal oxide.

3. The composition according to claim 1, wherein said black pigment is comprises iron oxide.

4. The composition according to claim 1, wherein said plurality of fine particles has a refractive index falling in a range of 1.40-1.90.

5. The composition according to claim 1, wherein said plurality of fine particles comprises silica.

6. A cured product obtained by curing said alkali-developable black photosensitive resin composition set forth in claim 1 by at least one of irradiation of actinic energy rays and heating.

7. A light-shielding barrier wall formed from a cured product which is obtained by curing said alkali-developable black photosensitive resin composition set forth in claim 1 by at least one of irradiation of actinic energy rays and heating.

8. An optic device having said light-shielding barrier wall set forth in claim 7.

9. The composition according to claim 1, wherein said black pigment is present in an amount of 0.1-7 vol. % of a total volume of said composition.

10. The composition according to claim 1, wherein said plurality of light-transmitting fine particles is present in an amount of not less than 50 parts by weight and not more than 500 parts by weight based on 100 parts by weight of said carboxyl group-containing photosensitive prepolymer.

11. The composition according to claim 1, wherein 15.9% of said light-transmitting fine particles have particle diameter of 1 μm or less.

12. The composition according to claim 1, wherein said average particle diameter of said black pigment is not more than 5 μm, and said average particle diameter of said plurality of light-transmitting fine particles is not more than 5 μm.

* * * * *